United States Patent [19]

Oppelt et al.

[11] Patent Number: 4,769,603

[45] Date of Patent: Sep. 6, 1988

[54] METHOD FOR THE OPERATION OF A NUCLEAR MAGNETIC RESONANCE APPARATUS

[75] Inventors: Arnulf Oppelt, Buckenhof; Rainer Graumann, Hoechstadt, both of Fed. Rep. of Germany

[73] Assignee: Siemens Aktiengesellschaft, Berlin and Munich, Fed. Rep. of Germany

[21] Appl. No.: 891,965

[22] Filed: Aug. 1, 1986

[30] Foreign Application Priority Data

Aug. 19, 1985 [DE] Fed. Rep. of Germany ....... 3529629
Mar. 11, 1986 [DE] Fed. Rep. of Germany ....... 3608054

[51] Int. Cl.[4] .......................................... G01R 33/20
[52] U.S. Cl. ................................................... 324/309
[58] Field of Search ............... 324/306, 307, 309, 311, 324/312

[56] References Cited

U.S. PATENT DOCUMENTS

| | | | |
|---|---|---|---|
| 4,339,716 | 7/1982 | Young | 324/309 |
| 4,509,011 | 4/1985 | Sugimoto et al. | 324/309 |
| 4,520,315 | 5/1985 | Leoffler et al. | 324/309 |
| 4,581,581 | 4/1986 | Pelc | 324/309 |

FOREIGN PATENT DOCUMENTS

| | | |
|---|---|---|
| 0135847 | 4/1985 | European Pat. Off. . |
| 60-29685 | 2/1985 | Japan . |
| 2048490 | 12/1980 | United Kingdom . |
| 1596160 | 8/1981 | United Kingdom . |

OTHER PUBLICATIONS

"FISP: A New Fast MRI Sequence," Oppelt et al, Siemens Electromedica, vol. 54, No. 1, 1986, pp. 15-18.
"NMR Imaging Techniques & Applications: A Review," Bottomley, Review of Scientific Instruments, vol. 53, No. 9, Sep. 1982, pp. 1319-1337.
"An Introduction to NMR Imaging: From the Bloch Equation to the Imaging Equation," Hinshaw et al, Proceedings of the IEEE, vol. 71, No. 3, Mar. 1983, pp. 338-350.
"Image Formation By Nuclear Magnetic Resonance: The Sensitive-Point Method," Hinshaw, Journal of Applied Physics, vol. 47, No. 8, Aug. 1976, pp. 3709-3721.
"NMR Images by the Multiple Sensitive Point Method: Application to Larger Biological Systems," Andrew et al, Phys. Med. Biol., 1977, vol. 22, No. 5, pp. 971-974.

*Primary Examiner*—Stewart J. Levy
*Assistant Examiner*—Kevin D. O'Shea
*Attorney, Agent, or Firm*—Hill, Van Santen, Steadman & Simpson

[57] ABSTRACT

A method for operating a nuclear magnetic resonance apparatus having coils for generating a fundamental magnetic field and gradient magnetic fields in which an examination subject is disposed, and having a transmitter/receiver for generating a sequence of high-frequency pulses and for acquiring nuclear magnetic resonance signals from the examination subject operates the apparatus by simply switching the gradient fields, leaving the gradient fields unmodulated. The pulse sequences generated by the pulse generator and by the gradient field coils are such that a dynamic equilibrium magnetization is generated. The method is particularly suitable for rapid generation of a tomographic image.

15 Claims, 4 Drawing Sheets

METHOD FOR THE OPERATION OF A NUCLEAR MAGNETIC RESONANCE APPARATUS

BACKGROUND OF THE INVENTION

1. Field of the Invention

The present invention relates to nuclear magnetic resonance devices, and in particular to a method for operating such a device.

2. Description of the Prior Art

Nuclear magnetic resonance devices are known in the art as exemplified by the apparatus described in U.S. Pat. No. 4,520,315. Such devices typically include coils for generating a fundamental magnetic field and coils for generating gradient magnetic fields in which an examination subject is disposed, a high-frequency means for generating a sequence of high-frequency pulses and for acquiring nuclear magnetic resonance signals from the examination subject.

Various operating modes for such devices are also known, such operation modes being characterized by differing chronological sequences of the high-frequency pulses and the gradient fields. The selection of a particular operating mode is essentially based upon the type of image information desired. Examples of such different operating modes are the spin-echo method (mixed-emphasis imaging with respect to $T_1$ and $T_2$), the inversion recovery method ($T_1$-emphasized imaging), the multi-slice method, and the multi-echo method. In general, a common goal is to obtain as much information as possible within short measuring times and with a high signal-to-noise ratio.

Imaging methods operating with steady state free precession (SFP) have become known as multiple sensitive point (MSP) methods as described in the scientific note "NMR Images By The Multiple Sensitive Point Method: Application To Larger Biological Systems," Andrew, et al, Phys. Med. Biol. 22, No. 5 (1977), pages 971-974. These methods, however, have not proven practical because they require modulated gradients thereby resulting in an imprecise slice selection. Moreover, the measuring time cannot be shortened because a slice selection is only possible at all by mean value formation.

SUMMARY OF THE INVENTION

It is an object of the present invention to provide a method for operating a nuclear magnetic resonance apparatus which operates with dynamic equilibrium magnetization of the spin system and which avoids the disadvantages of relatively imprecise slice selection and mean value formation which affect the MSP method.

It is a further object of the present invention to provide such an operating method wherein the desired image information can be acquired in an optimally short measuring time.

The above object is achieved in accordance with the principles of the present invention by maintaining the dynamic equilibrium magnetization with switched, unmodulated gradient fields as well as with a highly symmetrical high-frequency pulse sequence.

The nuclear moments are placed in a dynamic equilibrium condition in which a quasi-permanent high-transverse magnetization is inherent by a sequence of high-frequency pulses and gradient fields. In order to maintain this dynamic equilibrium condition, the HF-pulse sequence and the gradient pulse sequence must be high symmetrical. The signal S for a pixel in a nuclear magnetic resonance system has been derived in the Journal of Applied Physics 47, No. 8 (1976), at page 379 as follows:

$$S \approx \frac{\rho \sin \alpha}{1 + T_1/T_2 + (1 - T_1/T_2) \cos \alpha}.$$

$\rho$ = spin density
$T_1$ = longitudinal relaxation time
$T_2$ = transverse relaxation time
$\alpha$ = flip angle of the HF-pulses.

Dependent upon the ration of the relaxation times $T_1/T_2$, the signal level which can be achieved with the method described herein is approximately four through six times greater than in conventional imaging methods given the same measuring time. The flip angles of the HF-pulses should be set dependent upon the mean ratio $<T_1/T_2>$ such that an optium flip angle $\alpha_{opt}$ according to the following expression is achieved:

$$\alpha_{opt} = \text{arc cos} \frac{<T_1/T_2> - 1}{<T_1/T_2> + 1}.$$

in comparison to a flip angle of $\alpha = 90°$, the signal gain using the method disclosed herein can amount to a maximum of about 20 through 30%.

DESCRIPTION OF THE PREFERRED EMBODIMENTS

Figure 1:
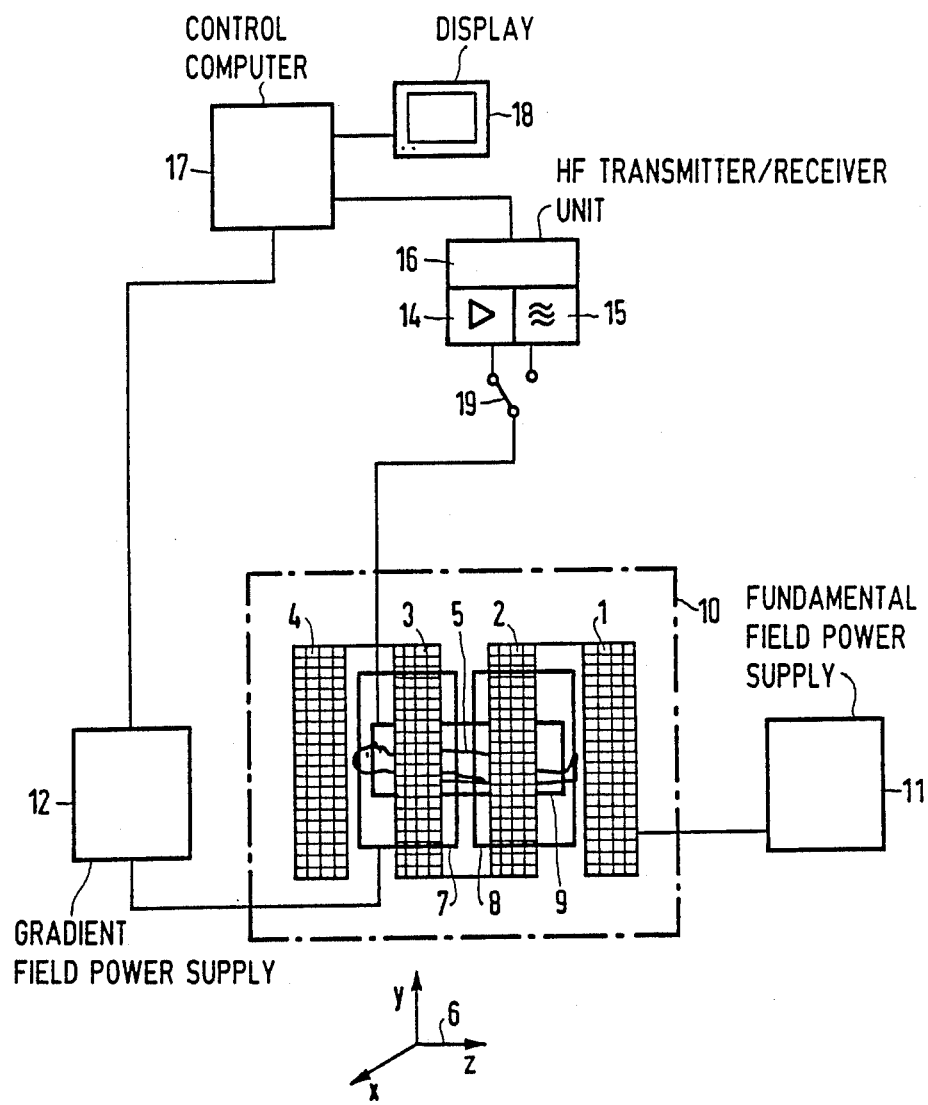
FIG. 1 is a schematic block diagram of a nuclear magnetic resonance tomograph apparatus of the type which can be operated in accordance with the principles of the method disclosed herein.

A nuclear magnetic resonance apparatus of the type which can be operated by the method disclosed herein is schematically shown in FIG. 1. The apparatus includes coils 1, 2, 3 and 4 for generating a fundamental magnetic field $B_0$ in which an examination subject 5 is disposed. The coils 1 through 4 are operated by a fundamental field power supply 11. The apparatus also includes gradient coils for generating independent orthogonal magnetic field gradients in the x, y and z directions as indicated at 6. For clarity, only gradient coils 7 and 8 are shown in FIG. 1. The coils 7 and 8 in combination with an opposite pair of identical gradient coils generate the x-gradient. Identical y-gradient coils (not shown) are disposed parallel to each other above and below the examination subject 5. Identical z-gradient field coils are disposed parallel to each other at the head and feet of the examination subject 5 at right angles relevant to the longitudinal axis of the subject 5. The apparatus further includes a high-frequency coil 9 for generating and measuring the nuclear magnetic resonance signals. The coils 1, 2, 3, 4, 7, 8 and 9 surrounded by the dashed line 10 represent the actual examination instrument in which the patient is disposed. As mentioned above, a fundamental field power supply 11 is provided for the fundamental coils, and a gradient power supply 12 is provided for the gradient coils. The measuring coil 9 is connected to a process control computer 17 through a signal amplifier 14 or through a high-frequency transmitter 15, depending upon the operating mode. The computer 17 generates signals for constructing a visible image on a display 18. The components 14 and 15 form a high-frequency transmitter/receiver unit 16, and a switch 19 enables switching from a transmitting mode to a receiving mode.

Figure 2:
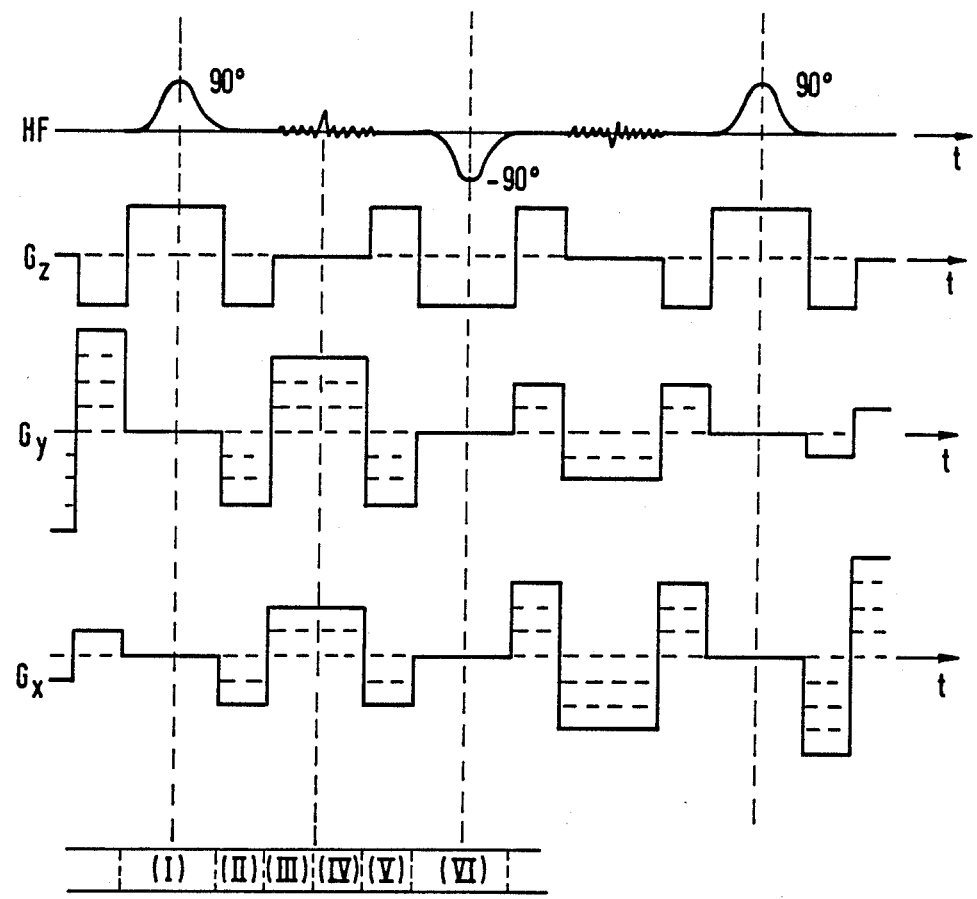
FIG. 2 shows a sequence of high-frequency pulses and switched gradients in accordance with the principles of the present invention for a projection reconstruction method.

One embodiment for an operating method for the apparatus shown in FIG. 1 in accordance with the principles of the present invention is shown in FIG. 2. The pulse sequences generated by the high-frequency transmitter 15 and the gradient field power supply 12 (which is switched) are shown in FIG. 2. As used herein, a scan includes all pulses which are required for measuring a line in the Fourier space and for restoration of the spin condition which existed before the scan. In the example shown in FIG. 2, a scan begins with excitation of the nuclei in period I for a duration T by means of a selective high-frequency pulse (the slice selection gradient $G_z$ being switched on) having a flip angle ($0° < \alpha \leq 90°$). In the following period II a de-phasing of the nuclear magnetization with respect to a defined spatial direction takes place by connecting a projection gradient $-G_r$ having the vector components $-G_x$ and $-G_y$ for a duration of approximately T/2. The projection gradient $-G_r$ is switched on approximately half as long as during the high-frequency excitation. In the subsequent periods III and IV (duration approximately T), the projection gradient is switched on with an opposite sign ($G_r$) which initiates bringing the spin moments back into phase. During the periods III and IV, the nuclear magnetic resonance signal emitted by the excited slice is simultaneously read out. The projection gradient $G_r$ thus remains switched on twice as long as previously. Any de-phasing which occurred in period IV is reversed in period V to an in-phase condition by means of a following projection gradient $-G_r$, again reversed in polarity. Additionally, a slice selection gradient $-G_z$ is switched on during period II, and a slice selection gradient $+G_z$ is switched on during period V.

The de-phasing events which occur within the slice thickness in the z-direction during the period I are thereby corrected. Because these processes are not influenced by the switching times of the projection gradient, the switching times for the projection gradient and for the slice selection gradient can overlap. A high-frequency pulse having a flip angle $-\alpha$ ($0° < \alpha \leq 90°$) given a negatively switched slice selection gradient initiates the next scan period VI. During the next scan, the same procedures and sequence occur as in the preceding scan, but using an opposite operational sign for the slice selection gradient and with a modified value of the projection gradient. The entire sequence is continued until the projection gradient has rotated by 180°.

Given a standard gradient strength of 3 mT/m, the high-frequency pulse lasts approximately 5 msec, the read-out time last approximately 5 msec, and the two periods II and V in combination also lasts approximately 5 msec. The above steps are repeated $N_r$ times, therefore $N_r$ projections are obtained. A projection is thus obtained every 15 msec. Given $N_r=180$ projections, measuring times of 2.7 seconds are obtainable.

Before beginning the actual data registration, it may be necessary to register a few projections under no-load conditions in order to set the dynamic equilibrium condition. Image reconstruction is accomplished by known methods of filtered back-projection.

Figure 3:
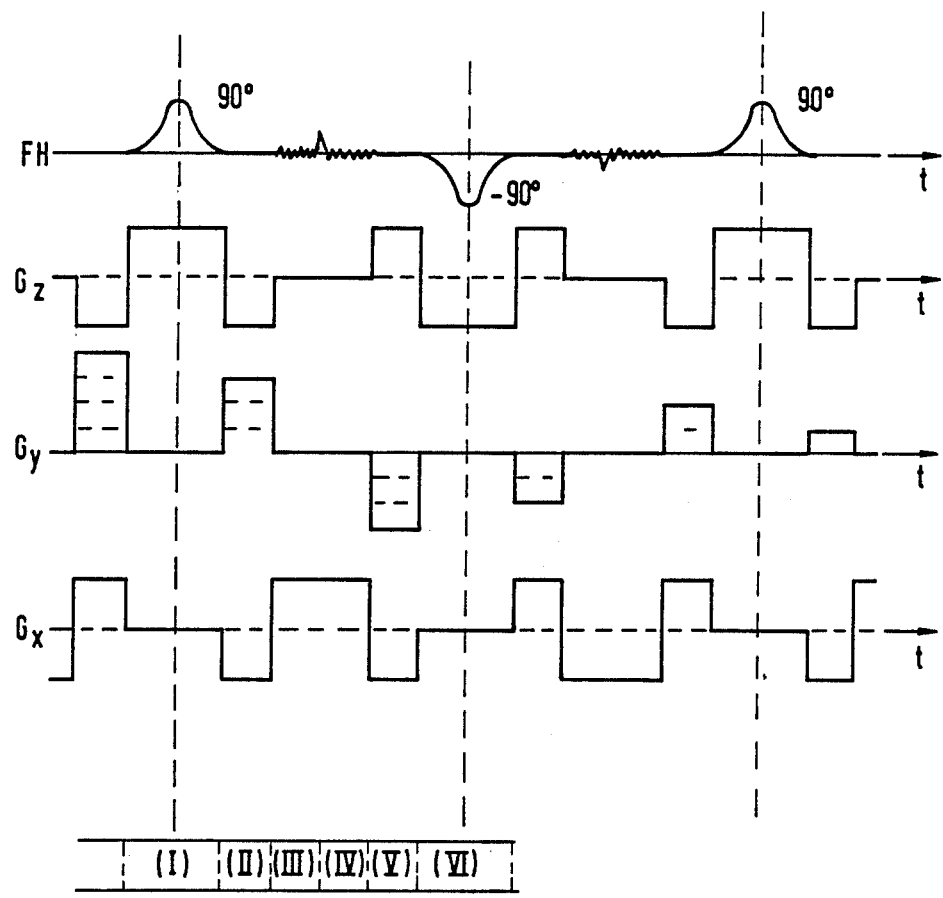
FIG. 3 shows a sequence of high-frequency pulses and switched gradients in accordance with the principles of the present invention for a 2D-Fourier reconstruction method.

A pulse sequence is shown in FIG. 3 in accordance with the principles of the present invention which can be used in connection with the 2D-Fourier reconstruction method. In this method, as is known, the nuclear magnetic resonance signals are always read out with the use of only one gradient field, for example, the x-gradient. It is therefore also referred to as the read-out gradient. N points of the nuclear resonance signal are read out. The steps are repeated $N_y$ times with the direction of the phase-coding gradient being changed by a selected amount for successive repetitions until $N_r$ scans are recorded. Using known 2D-Fourier reconstruction techniques, an image having $N_y \times N$ points is generated. The location information of the signal regarding the other spatial direction (such as the y-direction) is achieved by impressing a phase response which differs from scan to scan with a variable y-gradient (phase-coding gradient). In this method as well as in the previously described method, the pulse sequence and gradient sequence are highly symmetrical.

Figure 4:
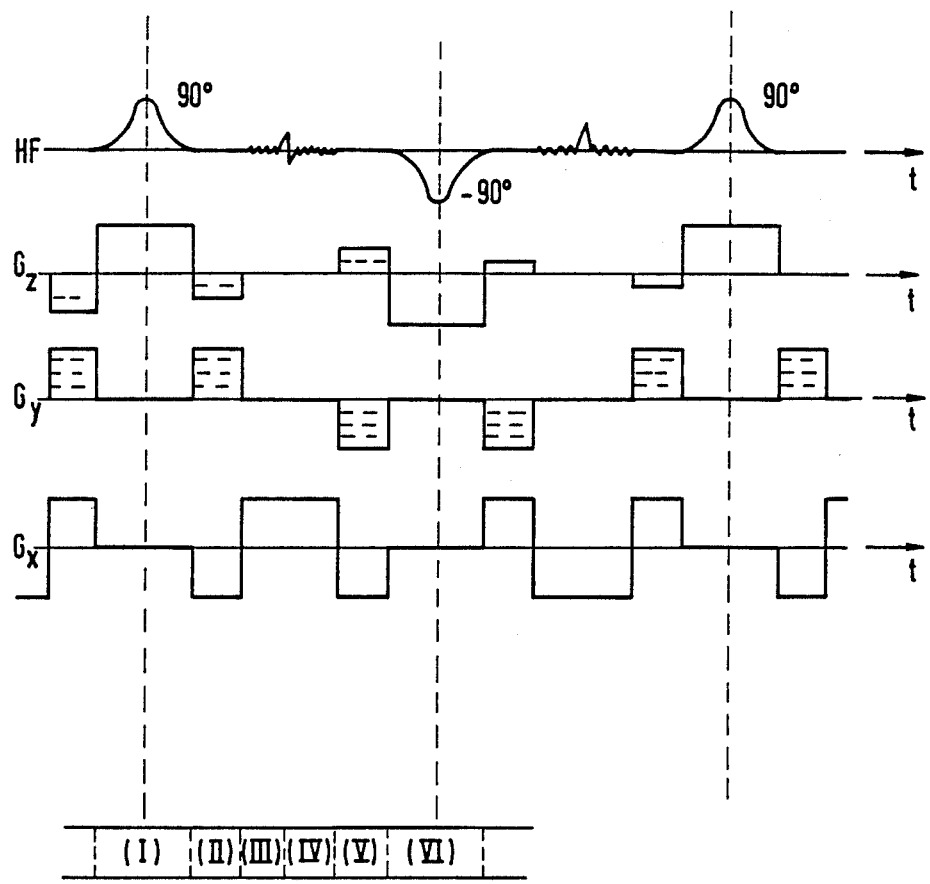
FIG. 4 shows a sequence of high-frequency pulses and switched gradients in accordance with the principles of the present invention for multi-slice exposures.

Another embodiment of the method is shown in FIG. 4 for producing multi-slice exposures. In this embodiment, a phase response dependent upon the z-coordinate is impressed during the time period II of the precessing nuclear spin. This phase response is impressed with the assistance of an additional slice gradient which is successively varied from scan to scan. As a result, the excited state can be resolved into $N_z$ sub-slices (images) in a subsequent 3D-Fourier reconstruction (given $N_z$ switching stages for $G_z$), each sub-slice or image having $N_y \times N_x$ points.

If non-ideal conditions are present in a nuclear magnetic resonance apparatus for exposure in accordance with the described methods, it may be preferable to depart from the otherwise required high degree of symmetry of the high-frequency and gradient pulse sequences. This may be preferably under the following conditions.

If, for example, due to the alternating switching of the slice selection gradients, different eddy currents for positive and negative amplitudes are generated, and a 2D-reconstruction method is employed, this can be expressed in a line structure of the register data of the Fourier space (even and odd lines appearing with different intensities). In order to suppress the multiple image appearing after the image reconstruction due to the line structure, the sequence can be modified such that the slice selection gradient exhibits the same switching behaviour for all Fourier lines (all scans).

Strip structures in the data of the registered Fourier space which appear due to the interference of two echo centers shifted in the read-out direciton can be eliminated by bringing the centers into coincidence by suitable adjustment of the pre-dephasing of the projection gradient or of the read-out gradient by modification of the time integral in the period II.

In other instances it may be preferable to switch the slice selection gradient and/or the projection or read-out gradient in the time span V. The shift of the dynamic equilibrium condition occurring due to the lack of these gradient pulses may result in deterioration of the image which is less than the interfering factors which may potentially occur due to the switching of these gradients.

Inhomogeneities of the fundamental field which may be present, shift the dynamic equilibrium in such a manner that the flip angle of the high-frequency pulse, alternating in operational sign, is not necessarily required for maintaining the equilibrium. A corresponding pulse sequence always having the same operational sign of the flip angle accordingly does not result in a substantial signal loss.

Although modifications and changes may be suggested by those skilled in the art it is the intention of the inventors to embody within the patent warranted hereon all changes and modifications as reasonably and properly come within the scope of their contribution to the art.

We claim as our invention:

1. A method for operating a nuclear magnetic resonance apparatus having means for generating a fundamental magnetic field and means for generating switched unmodulated gradient fields in which an examination subject is disposed, and means for inducing nuclear magnetic resonance in said examination subject by the application of high-frequency pulses and for acquiring nuclear magnetic resonance signals from said examination subject, said method maintaining dynamic equilibrium magnetization in said examination subject for image reconstruction by filtered back-projection and comprising the steps of:

selectively exciting a slice of said examination subject by simultaneously applying a slice selection gradient $G_z$ for a duration T and a high-frequency pulse having a flip angle $\alpha$, $0° < \alpha \leq 90°$;

simultaneously applying a projection gradient $-G_r$ and a slice selection gradient $-G_z$ to said examination subject for a duration of approximately T/2;

applying a projection gradient $G_r$ to said examination subject and reading out the nuclear magnetic resonance signal emitted by said examination subject for a duration of approximately T;

applying at least one of a slice selection gradient $G_z$ and a projection gradient $-G_r$ for a duration of approximately T/2; and repeating the above steps $N_r$ times with the direction of the projection gradient being changed by a selected amount for each successive repetition until $N_r$ scans are recorded.

2. A method as claimed in claim 1, wherein said steps are repeated with the operational sign of the slice selection gradient being alternated for successive repetitions.

3. A method as claimed in claim 1, wherein said steps are repeated with the operational sign of said flip angle being alternated for successive repetitions.

4. A method as claimed in claim 1, wherein the step of applying at least one of said slice selection gradient $G_z$ and said projection gradient $-G_r$ is further defined by simultaneously applying said slice selection gradient $G_z$ and said projection gradient $-G_r$.

5. A method as claimed in claim 1, wherein the step of simultaneously applying said projection gradient $-G_r$ and said slice selection gradient $-G_z$ is further defined by selecting a time integral for said projection gradient such that no echo centers are shifted in the read-out direction in Fourier space.

6. A method for operating a nuclear magnetic resonance apparatus having means for generating a fundamental magnetic field and means for generating switched unmodulated gradient fields in which an examination subject is disposed, and means for inducing nuclear magnetic resonance in said examination subject by the application of high-frequency pulses and for acquiring nuclear magnetic resonance signals from said examination subject, said method maintaining dynamic equilibrium magnetization in said examination subject for image reconstruction by 2D-Fourier imaging said method comprising the steps of:

selectively exciting a slice of said examination subject by simultaneously applying a slice selection gradient $G_z$ for a duration T and a high-frequency pulse having a flip angle $\alpha$, $0° < \alpha \leq 90°$;

simultaneously applying a read-out gradient $-G_x$, a phase-coding gradient $G_y$ and a slice selection gradient $-G_z$ to the examination subject for a duration of approximately T/2;

applying a read-out gradient $G_x$ to said examination subject and reading out N points of said nuclear magnetic resonance signal for a duration of approximately T;

simultaneously applying a phase coding gradient $-G_y$ and at least one of a read-out gradient $-G_x$ and a slice selection gradient $+G_z$ to said examination subject for a duration of approximately T/2;

repeating the above steps $N_y$ times with the direction of the phase coding gradient being changed by a selected amount for successive repetitions until $N_y$ scans are recorded; and generating an image comprising $N_y \times N$ points by 2D-Fourier transformation.

7. A method as claimed in claim 6, wherein said steps are repeated with the operational sign of the slice selection gradient being alternated for successive repetitions.

8. A method as claimed in claim 6, wherein said steps are repeated with the operational sign of said flip angle being alternated for successive repetitions.

9. A method as claimed in claim 2, wherein the step of applying said read-out gradient $-G_x$, said phase coding gradient $-G_y$ and said slice selection gradient $+G_z$ is further defined by simultaneously applying all of said read-out gradient, said phase coding gradient and said slice selection gradient to said examination subject.

10. A method as claimed in claim 6, wherein the step of simultaneously applying said read-out gradient $-G_x$, said phase coding gradient $G_y$ and said slice selection gradient $-G_z$ is further defined by selecting the time integral of the read-out gradient such that no echo centers are shifted in the read-out direction in Fourier space.

11. A method for operating a nuclear magnetic resonance apparatus having means for generating a fundamental magnetic field and means for generating switched unmodulated gradient fields in which an examination subject is disposed, and means for inducing nuclear magnetic resonance in said examination subject by the aplication of high-frequency pulses and for acquiring nuclear magnetic resonance signals from said examination subject, said method maintaining dynamic equilibrium magnetization in said examination subject for image reconstruction by 3D-Fourier imaging said method comprising the steps of:

selectively exciting a slice of said examination subject by simultaneously applying a slice selection gradient $G_z$ for a duration T and a high-frequency pulse having a flip angle $\alpha$, $0° < \alpha \leq 90°$;

simultaneously applying an x-gradient $-G_x$, a phase coding gradient $G_y$ and a slice selection gradient $-G_z$ to said examination subject for a duration of approximately T/2;

applying an x-gradient $G_x$ and reading out N points of the nuclear magnetic resonance signal from said examination subject for a duration of approximately T;

simultaneously applying an x-gradient $-G_x$ and a phase coding gradient $-G_y$ for a duration of approximately T/2;

repeating the above steps $N_y \times N_z$ times with the respective directions of the slice selection gradient and the phase coding gradient being changed by a selected amount for successive repetitions until a matrix of $N_z \times N_y$ scans is constructed; and reconstructing $N_z$ images each comprising $N_y \times N_x$ points by 3D-Fourier transformation.

12. A method as claimed in claim 11, wherein said steps are repeated with the operational sign of said slice selection gradient being alternated for successive repetitions.

13. A method as claimed in claim 11, wherein said steps are repeated with the operational sign of said flip angle being alternated for successive repetitions.

14. A method as claimed in claim 11, wherein the step of simultaneously applying said x-gradient $-G_x$ and said phase coding gradient $-G_y$ is further defined by also simultaneously applying a slice selection gradient $+G_z$.

15. A method as claimed in claim 11, wherein the steps of simultaneously applying said read-out gradient $-G_x$, said phase coding gradient $G_y$ and said slice selection gradient $-G_z$, further defined by selecting the time integral of the read-out gradient such that no echo centers are shifted in the read-out direction in Fourier space.

* * * * *